United States Patent
Ka

(10) Patent No.: US 9,621,142 B1
(45) Date of Patent: Apr. 11, 2017

(54) SEMICONDUCTOR DEVICE

(71) Applicant: SK hynix Inc., Icheon-si Gyeonggi-do (KR)

(72) Inventor: Dong Yoon Ka, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/983,013

(22) Filed: Dec. 29, 2015

(30) Foreign Application Priority Data

Oct. 12, 2015 (KR) ........................ 10-2015-0142082

(51) Int. Cl.
*H03L 7/00* (2006.01)
*H03K 5/06* (2006.01)

(52) U.S. Cl.
CPC ........ *H03K 5/06* (2013.01); *H03L 7/00* (2013.01)

(58) Field of Classification Search
USPC .................................................. 327/141, 161
See application file for complete search history.

(56) References Cited

U.S. PATENT DOCUMENTS

| | | | | |
|---|---|---|---|---|
| 6,392,466 B1* | 5/2002 | Fletcher | ................. | G06F 7/506 327/158 |
| 8,156,365 B2* | 4/2012 | Jang | ........................ | G09G 3/20 327/161 |
| 2005/0258881 A1* | 11/2005 | Schultz | ................. | H03L 7/0814 327/161 |
| 2013/0219208 A1* | 8/2013 | Lim | .......................... | G06F 1/04 713/503 |
| 2013/0285726 A1 | 10/2013 | Roytman et al. | | |
| 2015/0323579 A1* | 11/2015 | Im | ........................ | G01R 29/023 324/76.39 |
| 2016/0182060 A1* | 6/2016 | Im | .............................. | H03L 7/08 327/158 |

FOREIGN PATENT DOCUMENTS

KR          1020110098471 A          9/2011

* cited by examiner

*Primary Examiner* — Adam Houston
(74) *Attorney, Agent, or Firm* — William Park & Associates Ltd.

(57) ABSTRACT

A semiconductor device includes a skew sensing block configured to generate a first output signal according to a driving force for driving a first internal node and generate a second output signal according to a driving force for driving a second internal node, in response to an input signal; and a skew control signal generation block configured to generate skew control signals for controlling a skew of an internal circuit, by the first and second output signals.

29 Claims, 12 Drawing Sheets

SEMICONDUCTOR DEVICE

CROSS-REFERENCE TO RELATED APPLICATION

The present application claims priority under 35 U.S.C. §119(a) to Korean Patent Application No. 10-2015-0142082, filed on Oct. 12, 2015, in the Korean Intellectual Property Office, which is incorporated herein by reference in its entirety.

BACKGROUND

1. Technical Field

Embodiments of the present disclosure relate to a semiconductor device capable of compensating for skews.

2. Related Art

Transistors included in a semiconductor device may be divided into a typical case, a fast case and a slow case. In the typical case an operation speed belongs to an operation range according to an operation characteristic required by a manufacturer. In a fast case an operation speed is faster than the typical case. For a slow case an operation speed is slower than the typical case. Differences in operation characteristics of transistors lead to skew variations according to PVT (process, voltage, and temperature) variables.

In detail, skew variations according to PVT variables may include a process variation, a voltage variation, and a temperature variation. The process variation includes cases in which current characteristics of a transistor varies according to a variation in the thickness, width/length (W/L), sheet resistance and threshold voltage of a gate dielectric layer. The voltage variation may be according to a variation in a power supply voltage (VDD) supplied to a semiconductor device. The temperature variation may be influenced by an operation of the semiconductor device.

SUMMARY

Various embodiments are directed to a semiconductor device capable of sensing skews of transistors included therein and compensating for a skew of an internal circuit according to the sensed skews.

In an embodiment, a semiconductor device may include: a skew sensing block configured to generate a first output signal according to a driving force for driving a first internal node and generate a second output signal according to a driving force for driving a second internal node, in response to an input signal; and a skew control signal generation block configured to generate skew control signals for controlling a skew of an internal circuit, by the first and second output signals.

In an embodiment, a semiconductor device may include: a control block configured to generate counting signals which are counted in response to an enable signal and a strobe signal which includes a pulse generated in response to a clock; a skew sensing block configured to be controlled in driving forces for driving first and second internal nodes by the counting signals in response to an input signal, generate a first output signal according to the driving force for driving the first internal node, and generate a second output signal according to the driving force for driving the second internal node; and a skew control signal generation block configured to generate skew control signals for controlling a skew of an internal circuit, by the first and second output signals.

According to the embodiments, it is possible to sense skews of transistors included in a semiconductor device and compensate for the sensed skews.

Also, according to the embodiments, it is possible to sense skews of transistors included in a semiconductor device and compensate for a skew of an internal circuit according to the sensed skews, thereby substantially preventing an operation error of the internal circuit from occurring.

DETAILED DESCRIPTION

Hereinafter, a semiconductor device will be described below with reference to the accompanying drawings through various examples of embodiments.

Figure 1:
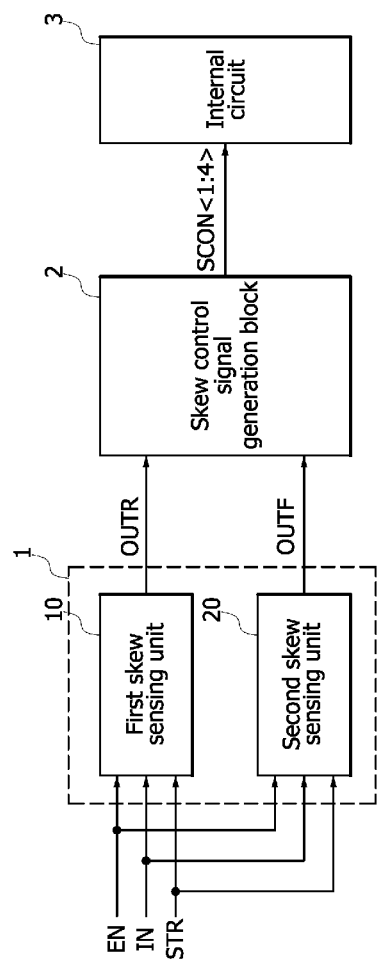
FIG. 1 is a block diagram illustrating a representation of an example configuration of a semiconductor device in accordance with an embodiment.

As shown in FIG. 1, a semiconductor device in accordance with an embodiment may include a skew sensing block 1, a skew control signal generation block 2, and an internal circuit 3. The skew sensing block 1 may include a first skew sensing unit 10 and a second skew sensing unit 20.

The first skew sensing unit 10 may generate a first output signal OUTR according to a driving force for driving an internal node nd11 (see FIG. 2), and in one embodiment, another driving force for driving the first internal node nd11, where the first internal node nd11 is driven in response to an enable signal EN and an input signal IN. The first skew sensing unit 10 may output the first output signal OUTR in synchronization with a strobe signal STR. The enable signal EN may be set as a signal which is enabled when a test mode for sensing a skew of the semiconductor device is entered. The input signal IN may be inputted as a signal which has a predetermined level, in the test mode. The predetermined level of the input signal IN may be set to a logic high level or a logic low level according to an embodiment. The strobe signal STR may be set as a pulse signal for outputting the first output signal OUTR. A driving force for driving the internal node nd11 to generate the first output signal OUTR will be explained in detail using a configuration which is described below.

The second skew sensing unit 20 may generate a second output signal OUTF according to a driving force for driving an internal node nd21 (see FIG. 3) and, in one embodiment, another driving force for driving the internal node nd21, where the internal node nd21 is driven in response to the enable signal EN and the input signal IN. The second skew sensing unit 20 may output the second output signal OUTF in synchronization with the strobe signal STR. The strobe signal STR may be set as a pulse signal for outputting the second output signal OUTF. A driving force for driving the internal node nd21 to generate the second output signal OUTF will be explained in detail using a configuration that is described below.

That is to say, the skew sensing block 1 may generate the first output signal OUTR according to a driving force for driving the internal node nd11 and generate the second output signal OUTF according to a driving force for driving the internal node nd21. The skew sensing block 1 may generate the first output signal OUTR and the second output signal OUTF in response to the enable signal EN and the input signal IN.

The skew control signal generation block 2 may generate first to fourth skew control signals SCON<1:4> for controlling a skew of the internal circuit 3, by the first output signal OUTR and the second output signal OUTF. A bit number of the first to fourth skew control signals SCON<1:4> for controlling a skew of the internal circuit 3 may be set variously according to an embodiment. Logic levels of the first to fourth skew control signals SCON<1:4> for controlling a skew of the internal circuit 3 may be set variously according to an embodiment.

In detail, logic levels of the first to fourth skew control signals SCON<1:4> for controlling a skew of the internal circuit 3 may be described as follows.

When the first skew control signal SCON<1> is enabled to a logic high level, a driving force of PMOS transistors included in the internal circuit 3 is increased.

When the second skew control signal SCON<2> is enabled to a logic high level, a driving force of the PMOS transistors included in the internal circuit 3 is decreased.

When the third skew control signal SCON<3> is enabled to a logic high level, a driving force of NMOS transistors included in the internal circuit 3 is increased.

When fourth skew control signal SCON<4> is enabled to a logic high level, a driving force of the NMOS transistors included in the internal circuit 3 is decreased.

The first to fourth skew control signals SCON<1:4> may compensate for skews of a plurality of transistors of the internal circuit 3. The internal circuit 3 may be realized as a general circuit which operates by including a plurality of PMOS transistors and a plurality of NMOS transistors. A skew of the internal circuit 3 may include at least any one among a delay amount, a driving speed, a driving force, a supply voltage and an internal temperature.

Figure 2:
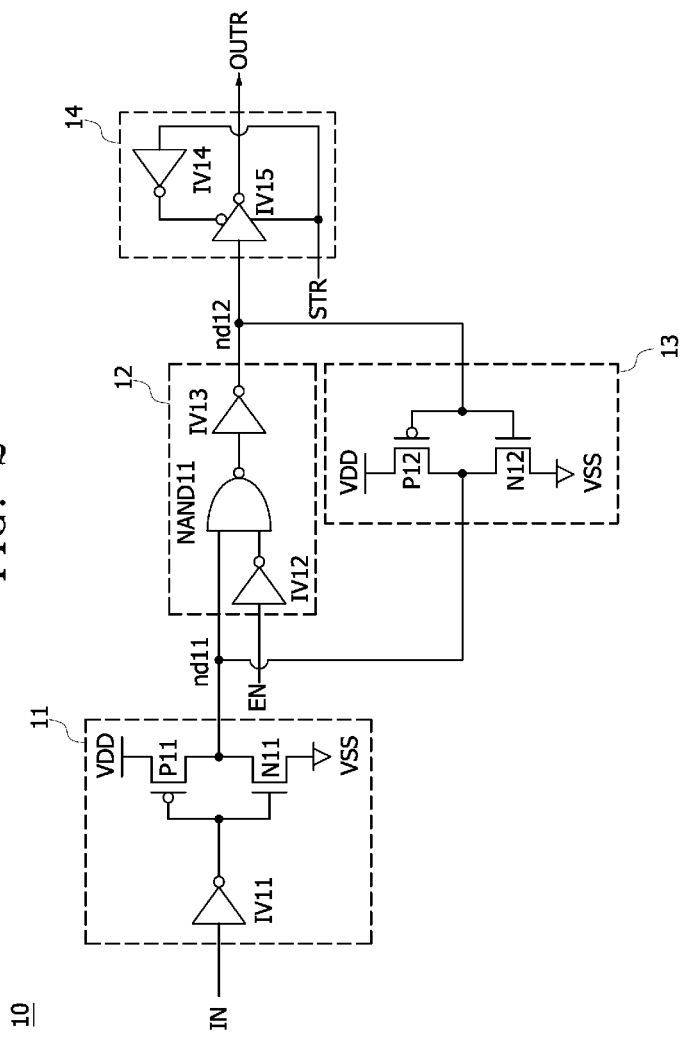
FIG. 2 is a circuit diagram illustrating a representation of an example configuration of the first skew sensing unit included in the semiconductor device shown in FIG. 1.

Referring to FIG. 2, the first skew sensing unit 10 in accordance with the embodiment may include a first driver 11, a first logic section 12, a first variable driving section 13, and a first buffer 14.

The first driver 11 may be realized by an inverter IV11, a first driving element P11 as a PMOS transistor and a second driving element N11 as an NMOS transistor. The first driver 11 may drive the internal node nd11 with a first driving force in response to the input signal IN. The first driving force for driving the internal node nd11 may include a driving force for the first driving element P11 to pull-up drive the internal node nd11 and a driving force for the second driving element N11 to pull-down drive the internal node nd11.

In detail, an operation for driving the internal node nd11 according to a coupling relationship of the first driver 11 is as follows.

The inverter IV11 inverts and buffers the input signal IN, and outputs a resultant signal.

The first driving element P11 may be positioned between a power supply voltage VDD and the internal node nd11, and may pull-up drive the internal node nd11 with the first driving force in response to the input signal IN received from the inverter IV11. An operation for the first driving element P11 to pull-up drive the internal node nd11 with the first driving force includes providing a driving force for the first driving element P11 needs to be turned on to drive the internal node nd11 to the power supply voltage VDD level when the output signal of the inverter IV11 is a logic low level to drive the internal node nd11 to the level of the power supply voltage VDD.

The second driving element N11 may be positioned between the internal node nd11 and a ground voltage VSS, and may pull-down drive the internal node nd11 with the first driving force in response to the input signal IN received from the inverter IV11. An operation for the second driving element N11 to pull-down drive the internal node nd11 with the first driving force includes providing a driving force for the second driving element N11 needs to be turned on to drive the internal node nd11 to the ground voltage VSS level when the output signal of the inverter IV11 is a logic high level.

Meanwhile, the driving forces of the first driving element P11 implemented as a PMOS transistor and the second driving element N11 implemented as an NMOS transistor may be the same as driving forces of a plurality of PMOS transistors and a plurality of NMOS transistors included in the internal circuit 3.

The first logic section 12 may be realized by an inverter IV12, a NAND gate NAND11, and an inverter IV13. The first logic section 12 may buffer the signal of the internal node nd11 and output a resultant signal to an internal node nd12 in response to the enable signal EN. The first logic section 12, may be positioned between the internal node nd11 and the internal node nd12 and may buffer the signal of the internal node nd11 and output a resultant signal to the internal node nd12, in response to the enable signal EN when the enable signal EN is enabled to a logic low level.

The first variable driving section 13 may be positioned between the internal node nd11 and internal node nd12. The first variable driving section 13 may be realized by a first pull-up element P12 as a PMOS transistor and a first pull-down element N12 as an NMOS transistor, and may drive the internal node nd11 with a second driving force in response to the signal of the internal node nd12. The second driving force for driving the internal node nd11 may include a driving force for the first pull-up element P12 to pull-up drive the internal node nd11 and a driving force for the first pull-down element N12 to pull-down drive the internal node nd11. The second driving force as the driving forces of the first pull-up element P12 and the first pull-down element N12 may be controlled variously according to an embodiment.

In detail, an operation for driving the internal node nd11 according to a coupling relationship of the first variable driving section 13 is as follows.

The first pull-up element P12 may be positioned between the power supply voltage VDD and the internal node nd11, and may pull-up drive the internal node nd11 with the second driving force in response to the signal of the internal node nd12. An operation for the first pull-up element P12 to pull-up drive the internal node nd11 with the second driving force includes providing a driving force for the first pull-up element P12 may need to be turned on when the signal of the internal node nd12 is a logic low level to drive the internal node nd11 to the power supply voltage VDD level.

The first pull-down element N12 may be positioned between the internal node nd11 and the ground voltage VSS, and may pull-down drive the internal node nd11 with the second driving force in response to the signal of the internal node nd12. An operation for the first pull-down element N12 to pull-down drive the internal node nd11 with the second driving force includes a driving force for the first pull-down element N12 may need to be turned on when the signal of the internal node nd12 is a logic high level to drive the internal node nd11 to the ground voltage VSS level.

The first buffer 14 may be realized by inverters IV14 and IV15, and the first buffer 14 may invert and buffer the signal of the internal node nd12 and output the first output signal OUTR in response to the strobe signal STR. The first buffer 14 may invert and buffer the signal of the internal node nd12 and output the first output signal OUTR, in response to the strobe signal STR of a logic high level.

Figure 3:
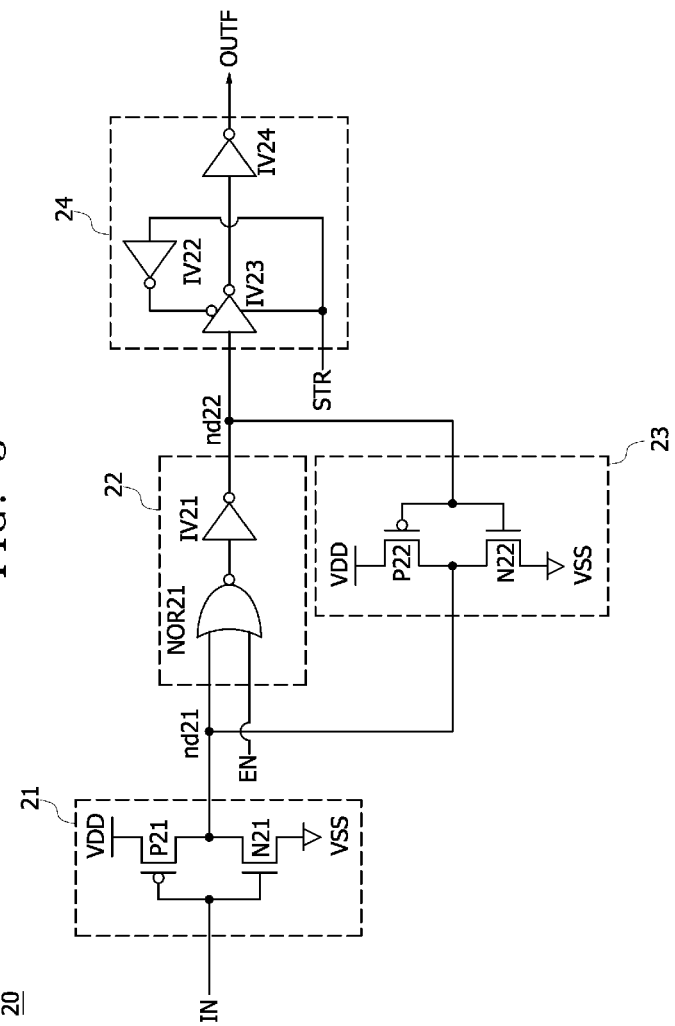
FIG. 3 is a circuit diagram illustrating a representation of an example configuration of the second skew sensing unit included in the semiconductor device shown in FIG. 1.

Referring to FIG. 3, the second skew sensing unit 20 in accordance with an embodiment may include a second driver 21, a second logic section 22, a second variable driving section 23, and a second buffer 24.

The second driver 21 may be realized by a third driving element P21 as a PMOS transistor and a fourth driving element N21 as an NMOS transistor, and may drive the internal node nd21 with a first driving force in response to the input signal IN. The first driving force for driving the internal node nd21 may include a driving force for the third driving element P21 to pull-up drive the internal node nd21 and a driving force for the fourth driving element N21 to pull-down drive the internal node nd21.

In detail, an operation for driving the internal node nd21 according to a coupling relationship of the second driver 21 is as follows.

The third driving element P21 may be positioned between the power supply voltage VDD and the internal node nd21, and may pull-up drive the internal node nd21 with the first driving force in response to the input signal IN. An operation for the third driving element P21 to pull-up drive the internal node nd21 with the first driving force includes a driving force for the third driving element P21 which may be turned on when the input signal IN is the logic low level to drive the internal node nd21 to the power supply voltage VDD level.

The fourth driving element N21 may be positioned between the internal node nd21 and the ground voltage VSS, and may pull-down drive the internal node nd21 with the first driving force in response to the input signal IN. An operation for the fourth driving element N21 to pull-down drive the internal node nd21 with the first driving force includes a driving force for the fourth driving element N21 which may be turned on when the input signal IN is the logic high level to drive the internal node nd21 to the level of the ground voltage VSS.

Meanwhile, the driving forces of the third driving element P21 as a PMOS transistor and the fourth driving element N21 as an NMOS transistor may be realized to be the same as the driving forces of the plurality of PMOS transistors and the plurality of NMOS transistors included in the internal circuit 3.

The second logic section 22 may be positioned between the internal node nd21 and internal node nd22. The second logic section 22 may be realized by a NOR gate NOR11 and an inverter IV21, and may buffer the signal of the internal node nd21 and output a resultant signal to an internal node nd22 in response to the enable signal EN. The second logic section 22 may buffer the signal of the internal node nd21 and output a resultant signal to the internal node nd22, when the enable signal EN is enabled to the logic low level.

The second variable driving section 23 may be positioned between the internal node nd21 and the internal node nd22. The second variable driving section 23 may be realized by a second pull-up element P22 as a PMOS transistor and a second pull-down element N22 as an NMOS transistor, and may drive the internal node nd21 with a second driving force in response to the signal of the internal node nd22. The second driving force for driving the internal node nd21 may include a driving force for the second pull-up element P22 to pull-up drive the internal node nd21, and a driving force for the second pull-down element N22 to pull-down drive the internal node nd21. The second driving force may be variously controlled according to an embodiment.

In detail, an operation for driving the internal node nd21 according to a coupling relationship of the second variable driving section 23 is as follows.

The second pull-up element P22 may be positioned between the power supply voltage VDD and the internal node nd21, and may pull-up drive the internal node nd21 with the second driving force in response to the signal of the internal node nd22. An operation for the second pull-up element P22 to pull-up drive the internal node nd21 with the second driving force includes a driving force for the second pull-up element P22 to be turned on when the signal of the internal node nd22 is a logic low level and to drive the internal node nd21 to the power supply voltage VDD level.

The second pull-down element N22 may be positioned between the internal node nd21 and the ground voltage VSS, and may pull-down drive the internal node nd21 with the second driving force in response to the signal of the internal node nd22. An operation for the second pull-down element N22 to pull-down drive the internal node nd21 with the second driving force includes a driving force for the second pull-down element N22 to be turned on when the signal of the internal node nd22 is a logic high level to drive the internal node nd21 to the level of the ground voltage VSS.

The second buffer 24 may be realized by inverters IV22, IV23 and IV24. The second buffer 24 may buffer the signal of the internal node nd22 and output the second output signal OUTF in synchronization with the strobe signal STR. The second buffer 24 may invert and buffer the signal of the internal node nd22 and output the second output signal OUTF in response to the strobe signal STR having the logic high level.

Operation of the semiconductor device in accordance with an embodiment, configured as mentioned above, will be described below with reference to FIGS. 4 to 7 by taking as an example an operation of sensing skews of driving elements included in drivers.

Figure 4:
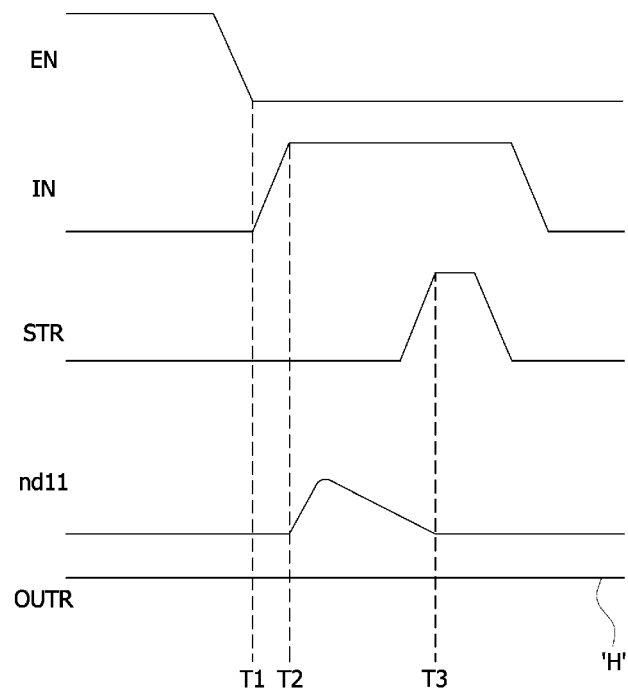
FIGS. 4 to 7 are representations of examples of timing diagrams to assist in an explanation of operation of the semiconductor device in accordance with an embodiment.

First, an operation of sensing a skew of the first driving element P11 as a PMOS transistor of the first driver 11 will be described below with reference to FIG. 4, when the first driving force according to the skew of the first driving element P11 is smaller than the second driving force of the first pull-down element N12 of the first variable driving section 13.

At time T1, the enable signal EN is enabled to the logic low level.

At time T2, the input signal IN is inputted with the logic high level.

The first driving element P11 pull-up drives the internal node nd11 with the first driving force because the output signal of the inverter IV11 is a logic low level. The second driving element N11 is turned off because the output signal of the inverter IV11 is the logic low level.

Since the internal node nd11 is driven to a logic high level, the first logic section 12 drives the internal node nd12 to the logic high level in response to the enable signal EN having the logic low level.

Since the internal node nd12 is driven to the logic high level, the first pull-down element N12 of the first variable driving section 13 pull-down drives the internal node nd11 with the second driving force. Since the internal node nd12 is the logic high level, the first pull-up element P12 is turned off.

In one example, the first output signal OUTR may be generated as the internal node nd11 is driven by a sum of the first driving force of the first driving element P11 and the second driving force of the first pull-down element N12.

In other words, when the first driving force according to the skew of the first driving element P11 is smaller than the second driving force of the first pull-down element N12, the internal node nd11 is gradually pull-down driven.

At time T3, the strobe signal STR is inputted with the logic high level.

Since the internal node nd11 is a logic low level, the first logic section 12 drives the internal node nd12 to the logic low level in response to the enable signal EN having the logic low level.

The first buffer 14 inverts and buffers the signal of the internal node nd12 and generates the first output signal OUTR of a logic high level in synchronization with the strobe signal STR having the logic high level. The first output signal OUTR is generated with the logic high level means that the first driving force according to the skew of the first driving element P11 is slower than a typical case. Also, according to an embodiment, when the first output signal OUTR is generated to a logic low level may mean that the first driving force according to the skew of the first driving element P11 corresponds to a typical case.

Figure 5:
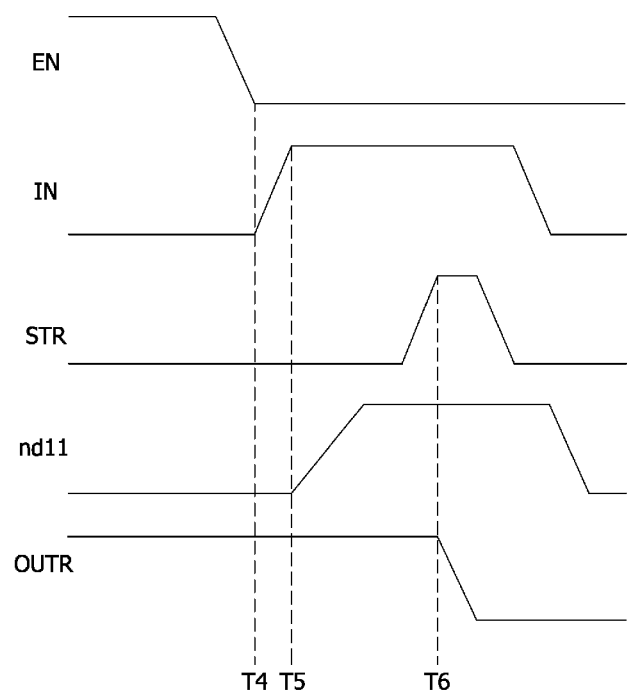

Next, an operation of sensing a skew of the first driving element P11 as a PMOS transistor of the first driver 11 will be described below with reference to FIG. 5, when the first driving force according to the skew of the first driving element P11 is larger than the second driving force of the first pull-down element N12 of the first variable driving section 13.

At time T4, the enable signal EN is enabled to the logic low level.

At time T5, the input signal IN is inputted with the logic high level.

The first driving element P11 pull-up drives the internal node nd11 with the first driving force because the output signal of the inverter IV11 is the logic low level. The second driving element N11 is turned off because the output signal of the inverter IV11 is the logic low level.

Since the internal node nd11 is the logic high level, the first logic section 12 drives the internal node nd12 to the logic high level in response to the enable signal EN having the logic low level.

Since the internal node nd12 is driven to the logic high level, the first pull-down element N12 pull-down drives the internal node nd11 with the second driving force. Since the internal node nd12 is the logic high level, the first pull-up element P12 is turned off.

The internal node nd11 is driven by a sum of the first driving force of the first driving element P11 and the second driving force of the first pull-down element N12.

Namely, when the first driving force according to the skew of the first driving element P11 is larger than the second driving force of the first pull-down element N12, the internal node nd11 is not pull-down driven.

At a time T6, the strobe signal STR is inputted with the logic high level.

Since the internal node nd11 is a logic high level, the first logic section 12 drives the internal node nd12 to the logic high level in response to the enable signal EN having the logic low level.

The first buffer 14 inverts and buffers the signal of the internal node nd12 and generates the first output signal OUTR having the logic low level, in synchronization with the strobe signal STR having the logic high level. First output signal OUTR generated with the logic low level means that the first driving force according to the skew of the first driving element P11 is faster than a typical case.

Figure 6:
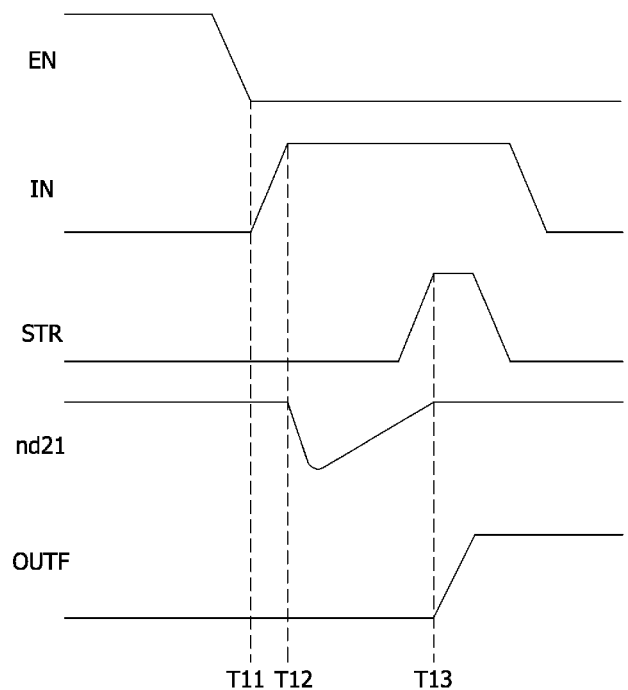

In succession, an operation of sensing a skew of the fourth driving element N21 as an NMOS transistor of the second driver 21 will be described below with reference to FIG. 6, when the first driving force according to the skew of the fourth driving element N21 is smaller than the second driving force of the second pull-up element P22 of the second variable driving section 23.

At time T11, the enable signal EN is enabled to the logic low level.

At time T12, the input signal IN is inputted with the logic high level.

The fourth driving element N21 pull-down drives the internal node nd21 with the first driving force since the input signal IN is the logic high level. Since the input signal IN is the logic high level, the third driving element P21 is turned off.

Since the internal node nd21 is driven to a logic low level, the second logic section 22 drives the internal node nd22 to the logic low level in response to the enable signal EN having the logic low level.

Since the internal node nd22 is driven to the logic low level, the second pull-up element P22 of the second variable driving section 23 pull-up drives the internal node nd21 with the second driving force. Since the internal node nd22 is the logic low level, the second pull-down element N22 is turned off.

The second output signal OUTF is generated as the internal node nd21 is driven by a sum of the first driving force of the fourth driving element N21 and the second driving force of the second pull-up element P22.

That is to say, when the first driving force according to the skew of the fourth driving element N21 is smaller than the second driving force of the second pull-up element P22, the internal node nd21 is gradually pull-up driven.

At time T13, the strobe signal STR is inputted with the logic high level.

Since the internal node nd21 is a logic high level, the second logic section 22 drives the internal node nd22 to the logic high level in response to the enable signal EN having the logic low level.

The second buffer 24 buffers the signal of the internal node nd22 and generates the second output signal OUTF of a logic high level in synchronization with the strobe signal STR of a logic high level. The second output signal OUTF generated with the logic high level means that the first driving force according to the skew of the fourth driving element N21 is slower than a typical case. Also, according to an embodiment, when the second output signal OUTF is generated to a logic low level may mean that the first driving force according to the skew of the fourth driving element N21 corresponds to the typical case.

Figure 7:
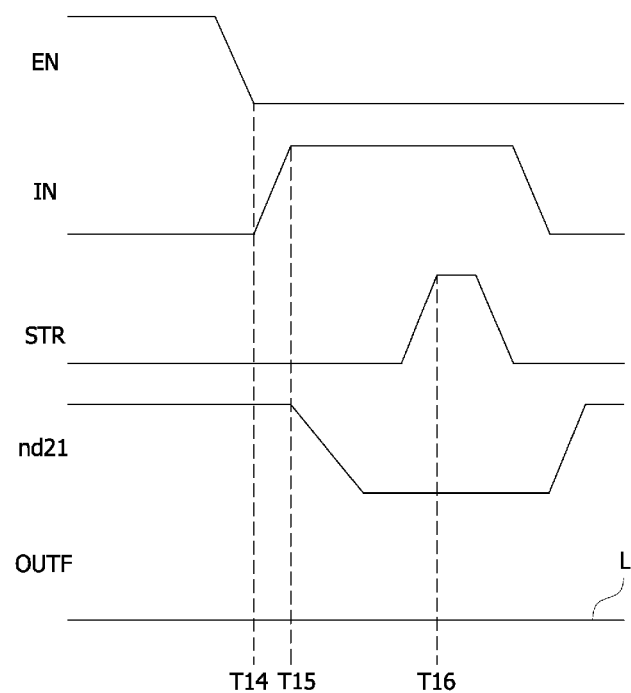

Next, an operation of sensing a skew of the fourth driving element N21 as an NMOS transistor of the second driver 21 will be described below with reference to FIG. 7, when the first driving force according to the skew of the fourth driving element N21 is larger than the second driving force of the second pull-up element P22 of the second variable driving section 23.

At time T14, the enable signal EN is enabled to the logic low level.

At time T15, the input signal IN is inputted with the logic high level.

The fourth driving element N21 pull-down drives the internal node nd21 with the first driving force because the input signal IN is the logic high level. Because the input signal IN is the logic high level, the third driving element P21 is turned off.

Since the internal node nd21 is driven to the logic low level, the second logic section 22 drives the internal node nd22 to the logic low level in response to the enable signal EN having the logic low level.

Since the internal node nd22 is driven to the logic low level, the second pull-up element P22 of the second variable driving section 23 pull-up drives the internal node nd21 with the second driving force. Since the internal node nd22 is the logic low level, the second pull-down element N22 is turned off.

The internal node nd21 is driven by a sum of the first driving force of the fourth driving element N21 and the second driving force of the second pull-up element P22.

In other words, when the first driving force according to the skew of the fourth driving element N21 is larger than the second driving force of the second pull-up element P22, the internal node nd21 is not pull-up driven.

At time T16, the strobe signal STR is inputted with the logic high level.

Since the internal node nd21 has a logic low level, the second logic section 22 drives the internal node nd22 to the logic low level in response to the enable signal EN having the logic low level.

The second buffer 24 buffers the signal of the internal node nd22 and generates the second output signal OUTF having the logic low level in synchronization with the strobe signal STR having the logic high level. The second output signal OUTF generated to the logic low level means that the first driving force according to the skew of the fourth driving element N21 is faster than a typical case.

Operation of the semiconductor device in accordance with an embodiment will be described below with reference to FIGS. 1 to 7, by taking as examples a case where a driving force according to a skew of the first driving element P11 is slower than a typical case, and the case where a driving force according to a skew of the fourth driving element N21 is faster than the typical case.

The first skew sensing unit 10 generates the first output signal OUTR according to a driving force for driving the internal node nd11 in response to the enable signal EN and the input signal IN. The first output signal OUTR is generated to the logic high level as described above with reference to FIG. 4.

The second skew sensing unit 20 may generate the second output signal OUTF according to a driving force for driving the internal node nd21. The second skew sensing unit 20 may generate the second output signal OUTF in response to the enable signal EN and the input signal IN. The second output signal OUTF is generated to the logic low level as described above with reference to FIG. 7.

The skew control signal generation block 2 is inputted with the first output signal OUTR having the logic high level and the second output signal OUTF having the logic low level, and the skew control signal generation block 2 generates the first skew control signal SCON<1> and the fourth skew control signal SCON<4> among the first to fourth skew control signals SCON<1:4> with logic high levels.

The internal circuit 3 is inputted with the first skew control signal SCON<1> having the logic high level, and operates by increasing the driving force of the plurality of PMOS transistors included in the internal circuit 3. Further, the internal circuit 3 is inputted with the fourth skew control signal SCON<4> having the logic high level, and operates by decreasing the driving force of the plurality of N MOS transistors included in the internal circuit 3.

As a consequence, the semiconductor device in accordance with the embodiment may sense skews of transistors which are included in the semiconductor device. Also, according to the embodiment, it is possible to sense skews of transistors included in the semiconductor device and compensate for a skew of an internal circuit according to the sensed skews, thereby substantially preventing an operation error of the internal circuit from occurring.

Figure 8:
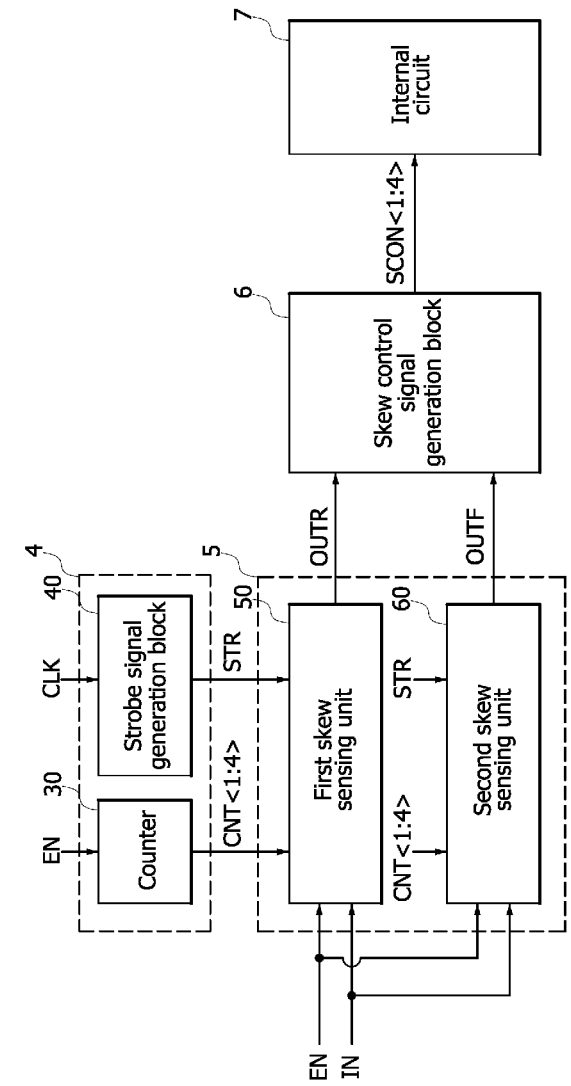
FIG. 8 is a block diagram illustrating a representation of an example configuration of a semiconductor device in accordance with another embodiment.

FIG. 8 is a block diagram illustrating a representation of an example of a configuration of a semiconductor device in accordance with another embodiment.

As shown in FIG. 8, a semiconductor device in accordance with another embodiment may include a control block 4, a skew sensing block 5, a skew control signal generation block 6, and an internal circuit 7. The control block 4 may include a counter 30 and a strobe signal generation unit 40. The skew sensing block 5 may include a first skew sensing unit 50 and a second skew sensing unit 60.

The counter 30 may generate first to fourth counting signals CNT<1:4> which are sequentially counted in response to an enable signal EN.

The strobe signal generation unit 40 may generate a strobe signal STR which includes a pulse generated during a predetermined period in response to a clock CLK.

A driving force of the first skew sensing unit 50 may be controlled by a driving force for driving an internal node nd51 (see FIG. 9) according to a combination of the first to fourth counting signals CNT<1:4> in response to the enable signal EN and an input signal IN. The first skew sensing unit 50 may generate a first output signal OUTR according to the driving force, including a first driving force and a second driving force, for driving the internal node nd51. The first skew sensing unit 50 may output the first output signal OUTR in synchronization with the strobe signal STR. The enable signal EN may be enabled when a test mode for sensing a skew of the semiconductor device is entered. The input signal IN may be inputted as a signal which has a predetermined level in the test mode. The predetermined level of the input signal IN may be set to a logic high level or a logic low level according to an embodiment. A driving force for driving the internal node nd51 to generate the first output signal OUTR will be explained in detail through a configuration described below.

A driving force of the second skew sensing unit 60 may be controlled by a driving force for driving an internal node nd61 (see FIG. 11) according to a combination of the first to fourth counting signals CNT<1:4> in response to the enable signal EN and the input signal IN. The second skew sensing unit 60 may generate a second output signal OUTF according to the driving force, including the first driving force and the second driving force, for driving the internal node nd61. The second skew sensing unit 60 may output the second output signal OUTF in synchronization with the strobe signal STR. A driving force for driving the internal node nd61 to generate the second output signal OUTF will be explained in detail through a configuration described below.

Namely, driving forces of the skew sensing block 5 may be controlled for driving the internal nodes nd51 and nd61 according to combinations of the first to fourth counting signals CNT<1:4> in response to the enable signal EN and the input signal IN. The skew sensing block 5 may generate the first output signal OUTR according to the driving force for driving the internal node nd51, and may generate the second output signal OUTF according to the driving force for driving the internal node nd61.

The skew control signal generation block 6 may generate first to fourth skew control signals SCON<1:4> for controlling a skew of the internal circuit 7, by the first output signal OUTR and the second output signal OUTF. The bit number of the first to fourth skew control signals SCON<1:4> for controlling a skew of the internal circuit 7 may be set variously according to an embodiment. Logic levels of the first to fourth skew control signals SCON<1:4> for controlling a skew of the internal circuit 7 may be set variously according to an embodiment.

In detail, logic levels of the first to fourth skew control signals SCON<1:4> for controlling a skew of the internal circuit 7 may be described as follows.

A case where the first skew control signal SCON<1> is enabled to a logic high level corresponds to increasing a driving force of PMOS transistors included in the internal circuit 7.

A case where the second skew control signal SCON<2> is enabled to a logic high level corresponds to decreasing a driving force of the PMOS transistors included in the internal circuit 7.

A case where the third skew control signal SCON<3> is enabled to a logic high level corresponds to increasing a driving force of NMOS transistors included in the internal circuit 3.

A case where the fourth skew control signal SCON<4> is enabled to a logic high level corresponds to decreasing a driving force of the NMOS transistors included in the internal circuit 7.

The first to fourth skew control signals SCON<1:4> may compensate for skews of a plurality of transistors of the internal circuit 7. The internal circuit 7 may be realized as a general circuit which performs an operation by including a plurality of PMOS transistors and a plurality of NMOS transistors. A skew of the internal circuit 7 may include at least any one among a delay amount, a driving speed, a driving force, a supply voltage, and an internal temperature.

Figure 9:
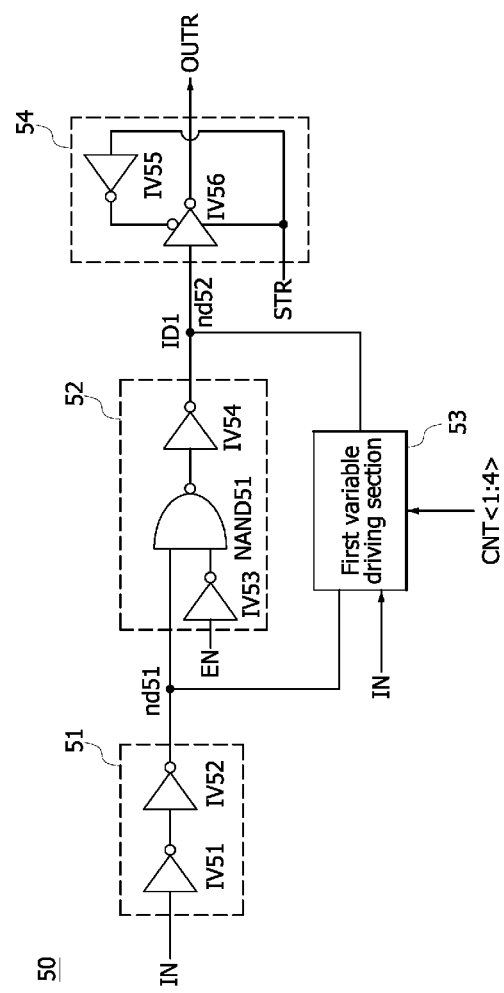
FIG. 9 is a diagram illustrating a representation of an example configuration of a first skew sensing unit included in the semiconductor device shown in FIG. 8.

Referring to FIG. 9, the first skew sensing unit 50 in accordance with another embodiment may include a first driver 51, a first logic section 52, a first variable driving section 53, and a first buffer 54.

The first driver 51 may be realized by inverters IV51 and IV52, and may drive the internal node nd51 with a first driving force in response to the input signal IN. Since the first driver 51 has a substantially similar configuration and performs substantially the same operation as the first driver 11 shown in FIG. 2, a detailed description thereof will be omitted. Also, since the inverter IV52 has a substantially similar configuration and performs substantially the same operation as the first driving element P11 and the second driving element N11 shown in FIG. 2, detailed description thereof will be omitted.

The first logic section 52 may be positioned between the internal node nd51 and the internal node nd52. The first logic section 52 may be realized by an inverter IV53, a NAND gate NAND51 and an inverter IV54. The first logic section 52 may buffer the signal of the internal node nd51, generate a first delayed signal ID1 and output the first delayed signal ID1 to an internal node nd52, in response to the enable signal EN. The first logic section 52 may buffer the signal of the internal node nd51, generate the first delayed signal ID1 and output the first delayed signal ID1 to the internal node nd52, in the case where the enable signal EN is enabled to a logic low level.

The first variable driving section 53 may be positioned between the internal node nd51 and the internal node nd52. The first variable driving section 53 may be controlled by a driving force for driving the internal node nd51 by the first to fourth counting signals CNT<1:4> in response to the first delayed signal ID1, and The first variable driving section 53 may also drive the internal node nd51 with a second driving force. The second driving force may be controlled variously by a combination of the first to fourth counting signals CNT<1:4>.

The first buffer 54 may be realized by inverters IV55 and IV56, and may invert and buffer the signal of the internal node nd52 and output the first output signal OUTR, in response to the strobe signal STR. The first buffer 54 may invert and buffer the signal of the internal node nd52 and output the first output signal OUTR, in response to the strobe signal STR of a logic high level.

Figure 10:
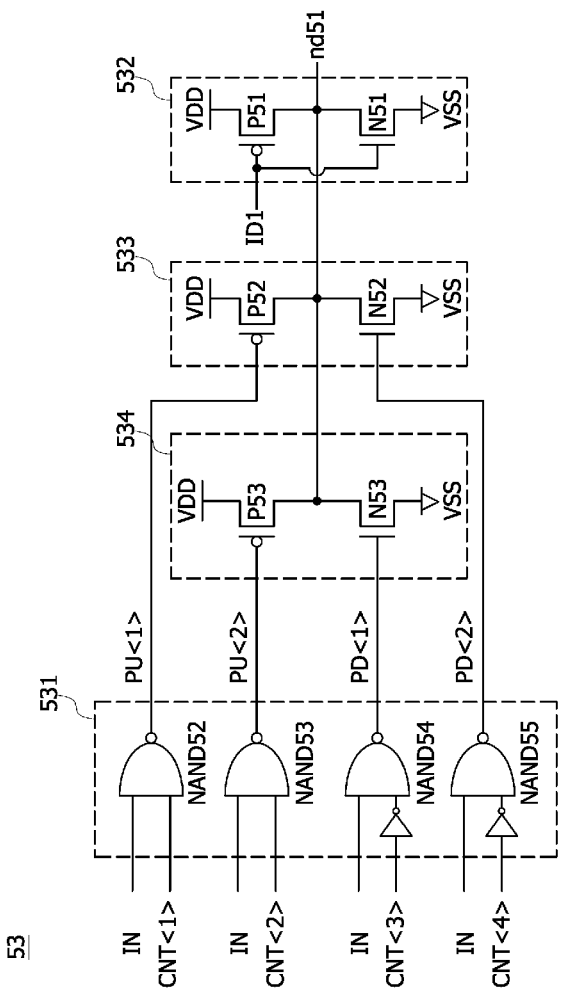
FIG. 10 is a circuit diagram illustrating a representation of an example configuration of a first variable driving section included in the first skew sensing unit shown in FIG. 9.

Referring to FIG. 10, the first variable driving section 53 in accordance with another embodiment may include a first pull-up/pull-down signal generation part 531, a first driving part 532, a second driving part 533, and a third driving part 534.

The first pull-up/pull-down signal generation part 531 may be realized by NAND gates NAND52, NAND53, NAND54 and NAND55. The first pull-up/pull-down signal generation part 531 may generate first and second pull-up signals PU<1:2> and first and second pull-down signals PD<1:2> in response to the input signal IN, where the first and second pull-up signals PU<1:2> and first and second pull-down signals PD<1:2> may be enabled according to the first to fourth counting signals CNT<1:4>.

The first driving part 532 drives the internal node nd51 in response to the first delayed signal ID1.

The second driving part 533 drives the internal node nd51 in response to the first pull-up signal PU<1> and the second pull-down signal PD<2>.

The third driving part 534 drives the internal node nd51 in response to the second pull-up signal PU<2> and the first pull-down signal PD<1>.

The second driving force which drives the internal node nd51 may be set to a sum of driving forces for the first driving part 532, the second driving part 533, and the third driving part 534. The driving force of the second driving part 533 may be larger or smaller than the driving force of the third driving part 534 according to an embodiment.

In detail, operations for the first pull-up/pull-down signal generation part 531 will be described below.

The first pull-up/pull-down signal generation part 531 may generate the first pull-up signal PU<1> when the input signal IN is generated with the logic high level and the first counting signal CNT<1> is generated to a logic high level.

The first pull-up/pull-down signal generation part 531 may generate the first pull-up signal PU<1> as described enabled to a logic low level.

The first pull-up/pull-down signal generation part 531 may generate the second pull-up signal PU<2> which is enabled to a logic low level, at a time when the input signal IN is generated to the logic high level and the second counting signal CNT<2> is generated to a logic high level.

The first pull-up/pull-down signal generation part 531 may generate the first pull-down signal PD<1> which is enabled to a logic high level, at a time when the input signal IN is generated to the logic high level and the third counting signal CNT<3> is generated to a logic high level.

The first pull-up/pull-down signal generation part 531 may generate the second pull-down signal PD<2> which is enabled to a logic high level, at a time when the input signal IN is generated to the logic high level and the fourth counting signal CNT<4> is generated to a logic high level.

In detail, operations for driving the internal node nd51 according to coupling relationships of the first to third driving parts 532, 533 and 534 are as follows.

The first driving part 532 may be realized by a first pull-up element P51 as a PMOS transistor which is positioned between a power supply voltage VDD and the internal node nd51 and may pull-up drive internal node nd51 in response to the first delayed signal ID1. The first driving part 532 may also include a first pull-down element N51 as an NMOS transistor which is positioned between the internal node nd51 and a ground voltage VSS and may pull-down drive the internal node nd51 in response to the first delayed signal ID1.

The second driving part 533 may be realized by a second pull-up element P52 as a PMOS transistor which is positioned between the power supply voltage VDD the internal node nd51 and may pull-up drive the internal node nd51 in response to the first pull-up signal PU<1>. The second driving part 533 may also include a second pull-down element N52 as an NMOS transistor which is positioned between the internal node nd51 and the ground voltage VSS and may pull-down drive the internal node nd51 in response to the second pull-down signal PD<2>.

The third driving part 534 may be realized by a third pull-up element P53 as a PMOS transistor which is positioned between the power supply voltage VDD and the internal node nd51 and may pull-up drive the internal node nd51 in response to the second pull-up signal PU<2>. The third driving part 534 may also include a third pull-down element N53 as an NMOS transistor which is positioned between the internal node nd51 and the ground voltage VSS, and may pull-down drive internal node nd51 in response to the first pull-down signal PD<1>.

Since operations of the first to third driving parts 532, 533 and 534 in accordance with another embodiment are controlled in their driving forces as the first to third driving parts 532, 533 and 534 are selectively driven by the first to fourth counting signals CNT<1:4> and may be easily realized through the first variable driving section 13 shown in FIG. 2 by a person skilled in the art, detailed description thereof will be omitted.

Figure 11:
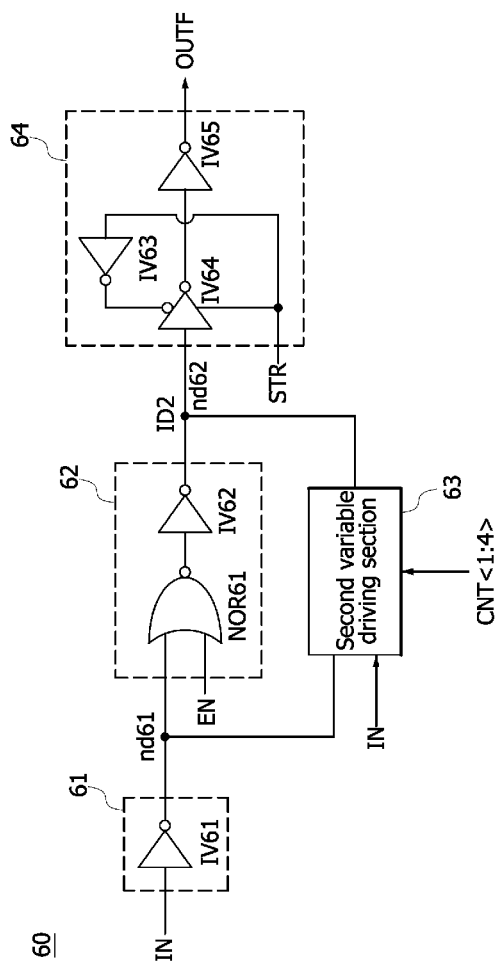
FIG. 11 is a diagram illustrating a representation of an example configuration of a second skew sensing unit included in the semiconductor device shown in FIG. 8.

Referring to FIG. 11, the second skew sensing unit 60 in accordance with another embodiment may include a second driver 61, a second logic section 62, a second variable driving section 63, and a second buffer 64.

The second driver 61 may be realized by an inverter IV61, and may drive the internal node nd61 with a first driving force in response to the input signal IN. Since the second driver 61 has a substantially similar configuration and performs substantially the same operation as the second driver 21 shown in FIG. 3, a detailed description thereof will be omitted herein. Further, since the inverter IV61 has a substantially similar configuration and performs substantially the same operation as the third driving element P21 and the fourth driving element N21 shown in FIG. 3, detailed description thereof will be omitted.

The second logic section 62 may be positioned between the internal node nd61 and the nd62. The second logic section 62 may be realized by a NOR gate NOR61 and an inverter IV62. The second logic section 62 may buffer the signal of the internal node nd61 to generate a second delayed signal ID2 and output the second delayed signal ID2 to an internal node nd62, in response to the enable signal EN. The second logic section 62 may buffer the signal of the internal node nd61, generate the second delayed signal ID2 and output the second delayed signal ID2 to the internal node nd62, in the case where the enable signal EN has the logic low level.

The second variable driving section 63 may positioned between the internal node nd61 and the internal node nd62. The second variable driving section 63 may be controlled by a driving force by the first to fourth counting signals CNT<1:4> in response to the second delayed signal ID2, and may drive the internal node nd61 with a second driving force. The second driving force may be controlled variously by the first to fourth counting signals CNT<1:4>.

The second buffer 64 may be realized by inverters IV63, IV64 and IV65, and may buffer the signal of the internal node nd62 and output the second output signal OUTF, in response to the strobe signal STR. The second buffer 64 may buffer the signal of the internal node nd62 and output the second output signal OUTF, in response to the strobe signal STR having the logic high level.

Figure 12:
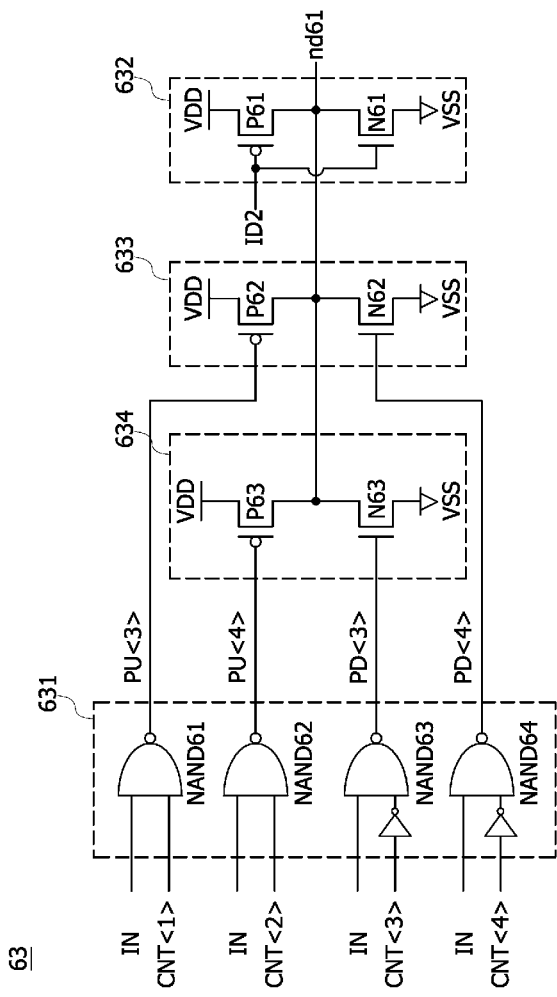
FIG. 12 is a circuit diagram illustrating a representation of an example configuration of a second variable driving section included in the second skew sensing unit shown in FIG. 11.

Referring to FIG. 12, the second variable driving section 63 in accordance with another embodiment may include a second pull-up/pull-down signal generation part 631, a fourth driving part 632, a fifth driving part 633, and a sixth driving part 634.

The second pull-up/pull-down signal generation part 631 may be realized by NAND gates NAND61, NAND62, NAND63 and NAND64. The second pull-up/pull-down signal generation part 631 may generate third and fourth pull-up signals PU<3:4> and third and fourth pull-down signals PD<3:4> in response to the input signal IN, where the third and fourth pull-up signals PU<3:4> and third and fourth pull-down signals PD<3:4> may be enabled according to the first to fourth counting signals CNT<1:4>.

The fourth driving part 632 drives the internal node nd61 in response to the second delayed signal ID2.

The fifth driving part 633 drives the internal node nd61 in response to the third pull-up signal PU<3> and the fourth pull-down signal PD<4>.

The sixth driving part 634 drives the internal node nd61 in response to the fourth pull-up signal PU<4> and the third pull-down signal PD<3>.

The second driving force which drives the internal node nd61 may be set to a sum of driving forces for the fourth driving part 632, the fifth driving part 633, and the sixth driving part 634. The driving force of the fifth driving part 633 may be larger or smaller than the driving force of the sixth driving part 634 according to an embodiment.

In detail, operations for the second pull-up/pull-down signal generation part 631 will be described below.

The second pull-up/pull-down signal generation part 631 may generate the third pull-up signal PU<3> which is enabled to a logic low level, at a time when the input signal IN is generated to the logic high level and the first counting signal CNT<1> is generated to the logic high level.

The second pull-up/pull-down signal generation part 631 may generate the fourth pull-up signal PU<4> when the input signal IN is generated to the logic high level and the second counting signal CNT<2> is generated to the logic high level. The second pull-up/pull-down signal generation part 631 may generate the fourth pull-up signal PU<4> as described enabled to a logic low level.

The second pull-up/pull-down signal generation part 631 may generate the third pull-down signal PD<3> which is enabled to a logic high level, at a time when the input signal IN is generated to the logic high level and the third counting signal CNT<3> is generated to the logic high level.

The second pull-up/pull-down signal generation part 631 may generate the fourth pull-down signal PD<4> which is enabled to a logic high level, at a time when the input signal IN is generated to the logic high level and the fourth counting signal CNT<4> is generated to the logic high level.

In detail, operations for driving the internal node nd61 according to coupling relationships of the fourth to sixth driving parts 632, 633 and 634 are as follows.

The fourth driving part 632 may be realized by a fourth pull-up element P61 as a PMOS transistor which is positioned between the power supply voltage VDD and the internal node nd61 and may pull-up drive the internal node nd61 in response to the second delayed signal ID2. The fourth driving part 632 may also include fourth pull-down element N61 as an NMOS transistor which is positioned between the internal node nd61 and the ground voltage VSS, and may pull-down drive the internal node nd61 in response to the second delayed signal ID2.

The fifth driving part 633 may be realized by a fifth pull-up element P62 as a PMOS transistor which is positioned between the power supply voltage VDD and the internal node nd61 and may pull-up drive the internal node nd61 in response to the third pull-up signal PU<3>. The fifth driving part 633 may also include a fifth pull-down element N62 as an NMOS transistor which is positioned between the internal node nd61 and the ground voltage VSS, and may pull-down drive the internal node nd61 in response to the fourth pull-down signal PD<4>.

The sixth driving part 634 may be realized by a sixth pull-up element P63 as a PMOS transistor which is positioned between the power supply voltage VDD and the internal node nd61 and may pull-up drive the internal node nd61 in response to the fourth pull-up signal PD<4>. The sixth driving part 634 may also include a sixth pull-down element N63 as an NMOS transistor which is positioned between the internal node nd61 and the ground voltage VSS, and may pull-down drive the internal node nd61 in response to the third pull-down signal PD<3>.

Since operations of the fourth to sixth driving parts 632, 633 and 634 in accordance with another embodiment are controlled in their driving forces as the fourth to sixth driving parts 632, 633 and 634 are selectively driven by the first to fourth counting signals CNT<1:4> and may be easily realized through the second variable driving section 23 shown in FIG. 3 by a person skilled in the art, detailed description thereof will be omitted.

As a consequence, the semiconductor device in accordance with the embodiment may sense skews of transistors which are included in the semiconductor device. Also, according to the embodiment, it is possible to sense skews of transistors included in the semiconductor device and compensate for a skew of an internal circuit according to the sensed skews, thereby substantially preventing an operation error of the internal circuit from occurring.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a skew sensing block configured to generate a first output signal according to a driving force for driving a first internal node and generate a second output signal according to a driving force for driving a second internal node, in response to an input signal; and
   a skew control signal generation block configured to generate skew control signals for controlling a skew of an internal circuit, by the first and second output signals.

2. The semiconductor device according to claim 1, wherein the first output signal which is generated as the first internal node is driven by a sum of a first driving force and a second driving force.

3. The semiconductor device according to claim 1, wherein the second output signal is generated as the second internal node is driven by a sum of a first driving force and a second driving force.

4. The semiconductor device according to claim 1, wherein the skew of the internal circuit includes at least any one among a delay amount, a driving speed, a driving force, a supply voltage and an internal temperature, and the internal circuit is controlled in the skew by the skew control signals.

5. The semiconductor device according to claim 1, wherein the skew sensing block comprises:
   a first skew sensing unit configured to generate the first output signal according to a first driving force for driving the first internal node and a second driving force for driving the first internal node, in response to an enable signal and the input signal; and
   a second skew sensing unit configured to generate the second output signal according to the first driving force for driving the second internal node and the second driving force for driving the second internal node, in response to the enable signal and the input signal.

6. The semiconductor device according to claim 5, wherein the first skew sensing unit comprises:
   a first driver configured to drive the first internal node with the first driving force in response to the input signal;
   a first logic section positioned between the first internal node and a third internal node, and configured to buffer a signal of the first internal node and output a resultant signal to the third internal node in response to the enable signal;
   a first variable driving section positioned between the first internal node and the third internal node, and configured to drive the first internal node with the second driving force in response to a signal of the third internal node; and
   a first buffer configured to invert and buffer the signal of the third internal node and generate the first output signal, in response to a strobe signal.

7. The semiconductor device according to claim 6, wherein the first driver comprises:
   a first driving element positioned between a power supply voltage and the first internal node, and configured to pull-up drive the first internal node with the first driving force in response to the input signal; and
a second driving element positioned between the first internal node and a ground voltage, and configured to pull-down drive the first internal node with the first driving force in response to the input signal.

8. The semiconductor device according to claim 6, wherein the first variable driving section comprises:
a first pull-up element positioned between the power supply voltage and the first internal node, and configured to pull-up drive the first internal node with the second driving force in response to the signal of the third internal node; and
a first pull-down element positioned between the first internal node and the ground voltage, and configured to pull-down drive the first internal node with the second driving force in response to the signal of the third internal node.

9. The semiconductor device according to claim 5, wherein the second skew sensing unit comprises:
a second driver configured to drive the second internal node with the first driving force in response to the input signal;
a second logic section positioned between the second internal node and a fourth internal node, and configured to buffer a signal of the second internal node and output a resultant signal to the fourth internal node in response to the enable signal;
a second variable driving section positioned between the second internal node and the fourth internal node, and configured to drive the second internal node with the second driving force in response to a signal of the fourth internal node; and
a second buffer configured to invert and buffer the signal of the fourth internal node and generate the second output signal in response to the strobe signal.

10. The semiconductor device according to claim 9, wherein the second driver comprises:
a third driving element positioned between the power supply voltage and the second internal node, and configured to pull-up drive the second internal node with the first driving force in response to the input signal; and
a fourth driving element positioned between the second internal node and the ground voltage, and configured to pull-down drive the second internal node with the first driving force in response to the input signal.

11. The semiconductor device according to claim 9, wherein the second variable driving section comprises:
a second pull-up element positioned between the power supply voltage and the second internal node, and configured to pull-up drive the second internal node with the second driving force in response to the signal of the fourth internal node; and
a second pull-down element positioned between the second internal node and the ground voltage, and configured to pull-down drive the second internal node with the second driving force in response to the signal of the fourth internal node.

12. A semiconductor device comprising:
a control block configured to generate counting signals which are counted in response to an enable signal and a strobe signal which includes a pulse generated in response to a clock;
a skew sensing block configured to be controlled in driving forces for driving first and second internal nodes by the counting signals in response to an input signal, generate a first output signal according to the driving force for driving the first internal node, and generate a second output signal according to the driving force for driving the second internal node; and
a skew control signal generation block configured to generate skew control signals for controlling a skew of an internal circuit, by the first and second output signals.

13. The semiconductor device according to claim 12, wherein the first output signal is generated as the first internal node is driven by a sum of a first driving force and a second driving force for driving the first internal node.

14. The semiconductor device according to claim 12, wherein the second output signal is generated as the second internal node is driven by a sum of a first driving force and a second driving force for driving the second internal node.

15. The semiconductor device according to claim 12, wherein the skew of the internal circuit includes at least any one among a delay amount, a driving speed, a driving force, a supply voltage and an internal temperature, and the internal circuit is controlled in the skew by the skew control signals.

16. The semiconductor device according to claim 12, wherein the skew sensing block comprises:
a first skew sensing unit configured to generate the first output signal according to the first driving force for driving the first internal node and the second driving force for driving the first internal node, in response to the enable signal, the input signal and the counting signals; and
a second skew sensing unit configured to generate the second output signal according to the first driving force for driving the second internal node and the second driving force for driving the second internal node, in response to the enable signal, the input signal and the counting signals.

17. The semiconductor device according to claim 16, wherein the second driving force is controlled according to a combination of the counting signals.

18. The semiconductor device according to claim 16, wherein the first skew sensing unit comprises:
a first driver configured to drive the first internal node with the first driving force in response to the input signal;
a first logic section positioned between the first internal node and a third internal node, and configured to output a first delayed signal generated by buffering a signal of the first internal node in response to the enable signal, to the third internal node;
a first variable driving section positioned between the first internal node and the third internal node, and configured to drive the first internal node with the second driving force that is controlled according to a combination of the counting signals, in response to the first delayed signal; and
a first buffer configured to invert and buffer the signal of the third internal node and generate the first output signal, in response to the strobe signal.

19. The semiconductor device according to claim 18, wherein the first driver comprises:
a first driving element positioned between a power supply voltage and the first internal node, and configured to pull-up drive the first internal node with the first driving force in response to the input signal; and
a second driving element positioned between the first internal node and a ground voltage, and configured to pull-down drive the first internal node with the first driving force in response to the input signal.

20. The semiconductor device according to claim 18, wherein the first variable driving section comprises:
a first pull-up/pull-down signal generation part configured to generate first and second pull-up signals and first and second pull-down signals in response to the input signal, where the first and second pull-up signals and first and second pull-down signals are enabled according to the counting signals;
a first driving part configured to drive the first internal node in response to the first delayed signal;
a second driving part configured to drive the first internal node in response to the first pull-up signal and the second pull-down signal; and
a third driving part configured to drive the first internal node in response to the second pull-up signal and the first pull-down signal.

21. The semiconductor device according to claim 20, wherein the first driving part comprises:
a first pull-up element positioned between the power supply voltage and the first internal node, and configured to pull-up drive the first internal node in response to the first delayed signal; and
a first pull-down element positioned between the first internal node and the ground voltage, and configured to pull-down drive the first internal node in response to the first delayed signal.

22. The semiconductor device according to claim 20, wherein the second driving part comprises:
a second pull-up element positioned between the power supply voltage and the first internal node, and configured to pull-up drive the first internal node in response to the first pull-up signal; and
a second pull-down element positioned between the first internal node and the ground voltage, and configured to pull-down drive the first internal node in response to the second pull-down signal.

23. The semiconductor device according to claim 20, wherein the third driving part comprises:
a third pull-up element positioned between the power supply voltage and the first internal node, and configured to pull-up drive the first internal node in response to the second pull-up signal; and
a third pull-down element positioned between the first internal node and the ground voltage, and configured to pull-down drive the first internal node in response to the first pull-down signal.

24. The semiconductor device according to claim 16, wherein the second skew sensing unit comprises:
a second driver configured to drive the second internal node with the first driving force in response to the input signal;
a second logic section positioned between the second internal node and a fourth internal node, and configured to output a second delayed signal to the fourth internal node, where the second delayed signal is generated by buffering a signal of the second internal node in response to the enable signal, to the fourth internal node;
a second variable driving section positioned between the second internal node and the fourth internal node, and configured to drive the second internal node with the second driving force that is controlled according to a combination of the counting signals, in response to the second delayed signal; and
a second buffer configured to invert and buffer the signal of the fourth internal node and generate the second output signal, in response to the strobe signal.

25. The semiconductor device according to claim 24, wherein the second driver comprises:
a third driving element positioned between the power supply voltage and the second internal node, and configured to pull-up drive the second internal node with the first driving force in response to the input signal; and
a fourth driving element positioned between the second internal node and the ground voltage, and configured to pull-down drive the second internal node with the first driving force in response to the input signal.

26. The semiconductor device according to claim 24, wherein the second variable driving section comprises:
a second pull-up/pull-down signal generation part configured to generate third and fourth pull-up signals and third and fourth pull-down signals in response to the input signal, where the third and fourth pull-up signals and third and fourth pull-down signals are enabled according to the counting signals;
a fourth driving part configured to drive the second internal node in response to the second delayed signal;
a fifth driving part configured to drive the second internal node in response to the third pull-up signal and the fourth pull-down signal; and
a sixth driving part configured to drive the second internal node in response to the fourth pull-up signal and the third pull-down signal.

27. The semiconductor device according to claim 26, wherein the fourth driving part comprises:
a fourth pull-up element positioned between the power supply voltage and the second internal node, and configured to pull-up drive the second internal node in response to the second delayed signal; and
a fourth pull-down element positioned between the second internal node and the ground voltage, and configured to pull-down drive the second internal node in response to the second delayed signal.

28. The semiconductor device according to claim 26, wherein the fifth driving part comprises:
a fifth pull-up element positioned between the power supply voltage and the second internal node, and configured to pull-up drive the second internal node in response to the third pull-up signal; and
a fifth pull-down element positioned between the second internal node and the ground voltage, and configured to pull-down drive the second internal node in response to the fourth pull-down signal.

29. The semiconductor device according to claim 26, wherein the sixth driving part comprises:
a sixth pull-up element positioned between the power supply voltage and the second internal node, and configured to pull-up drive the second internal node in response to the fourth pull-up signal; and
a sixth pull-down element positioned between the second internal node and the ground voltage, and configured to pull-down drive the second internal node in response to the third pull-down signal.

* * * * *